(12) United States Patent
Loss

(10) Patent No.: US 10,089,418 B2
(45) Date of Patent: Oct. 2, 2018

(54) STRUCTURE MODEL SEGMENTATION FROM A THREE DIMENSIONAL SURFACE

(71) Applicant: HERE Global B.V., Eindhoven (NL)

(72) Inventor: Leandro Augusto Loss, Newark, CA (US)

(73) Assignee: HERE Global B.V., Eindhoven (NL)

( * ) Notice: Subject to any disclaimer, the term of this patent is extended or adjusted under 35 U.S.C. 154(b) by 1056 days.

(21) Appl. No.: 14/154,864

(22) Filed: Jan. 14, 2014

(65) Prior Publication Data
US 2015/0199455 A1 Jul. 16, 2015

(51) Int. Cl.
G06F 17/50 (2006.01)
G06T 17/05 (2011.01)
G06K 9/00 (2006.01)
G06T 7/11 (2017.01)

(52) U.S. Cl.
CPC ..... *G06F 17/5004* (2013.01); *G06K 9/00201* (2013.01); *G06T 7/11* (2017.01); *G06T 17/05* (2013.01); *G06T 2200/04* (2013.01); *G06T 2207/10028* (2013.01); *G06T 2207/10032* (2013.01); *G06T 2207/30184* (2013.01)

(58) Field of Classification Search
CPC combination set(s) only.
See application file for complete search history.

(56) References Cited

U.S. PATENT DOCUMENTS

| 8,958,980 | B2* | 2/2015 | Miksa | G06F 17/30241 |
| | | | | 345/679 |
| 9,367,959 | B2* | 6/2016 | Forstall | G01C 21/3638 |
| 9,433,843 | B2* | 9/2016 | Morlock | G01C 21/20 |
| 9,449,227 | B2* | 9/2016 | Chen | G06K 9/0063 |
| 2006/0061566 | A1* | 3/2006 | Verma | G06T 17/20 |
| | | | | 345/419 |
| 2012/0321129 | A1* | 12/2012 | McLaughlin | G06K 9/00637 |
| | | | | 382/103 |
| 2013/0127852 | A1* | 5/2013 | Menkov | G01C 21/20 |
| | | | | 345/420 |
| 2013/0202197 | A1* | 8/2013 | Reeler | G01S 17/89 |
| | | | | 382/154 |

(Continued)

OTHER PUBLICATIONS

Wang, Shugen, Qiuyuan Gou, and Mingwei Sun. "Simple building reconstruction from lidar data and aerial imagery." In Remote Sensing, Environment and Transportation Engineering (RSETE), 2012 2nd International Conference on, pp. 1-5. IEEE, 2012.*

(Continued)

*Primary Examiner* — Aniss Chad
(74) *Attorney, Agent, or Firm* — Alston & Bird LLP

(57) ABSTRACT

Segmenting a three dimensional (3D) model of a structure may involve distinguishing vertically oriented surface elements from horizontally oriented surface elements of a three 3D surface representing a geographic area. The geographic area involves at least one structure. Segmenting a 3D model may also involve distinguishing ground surface elements from rooftop surface elements of the horizontally oriented surface elements of the 3D surface. Segmenting a 3D model may then involve associating the vertically oriented surface elements with the rooftop surface elements to form at least one segmented model of the at least one structure.

19 Claims, 6 Drawing Sheets

(56) References Cited

U.S. PATENT DOCUMENTS

2014/0198978 A1* 7/2014 Chen .................. G06T 17/05
　　　　　　　　　　　　　　　　　382/154
2015/0081252 A1* 3/2015 Loss ................ G06F 17/5004
　　　　　　　　　　　　　　　　　703/1

OTHER PUBLICATIONS

Paris in 3D, 2013, Ubick.
Photogrammetry, Modified Dec. 27, 2013, Wikipedia, the free Encyclopedia.
Polygon Mesh, Modified Oct. 11, 2013, Wikipedia, the free Encyclopedia.
Wavefront .obj File, modified Dec. 3, 2013, Wikipedia, the free Encyclopedia.

* cited by examiner

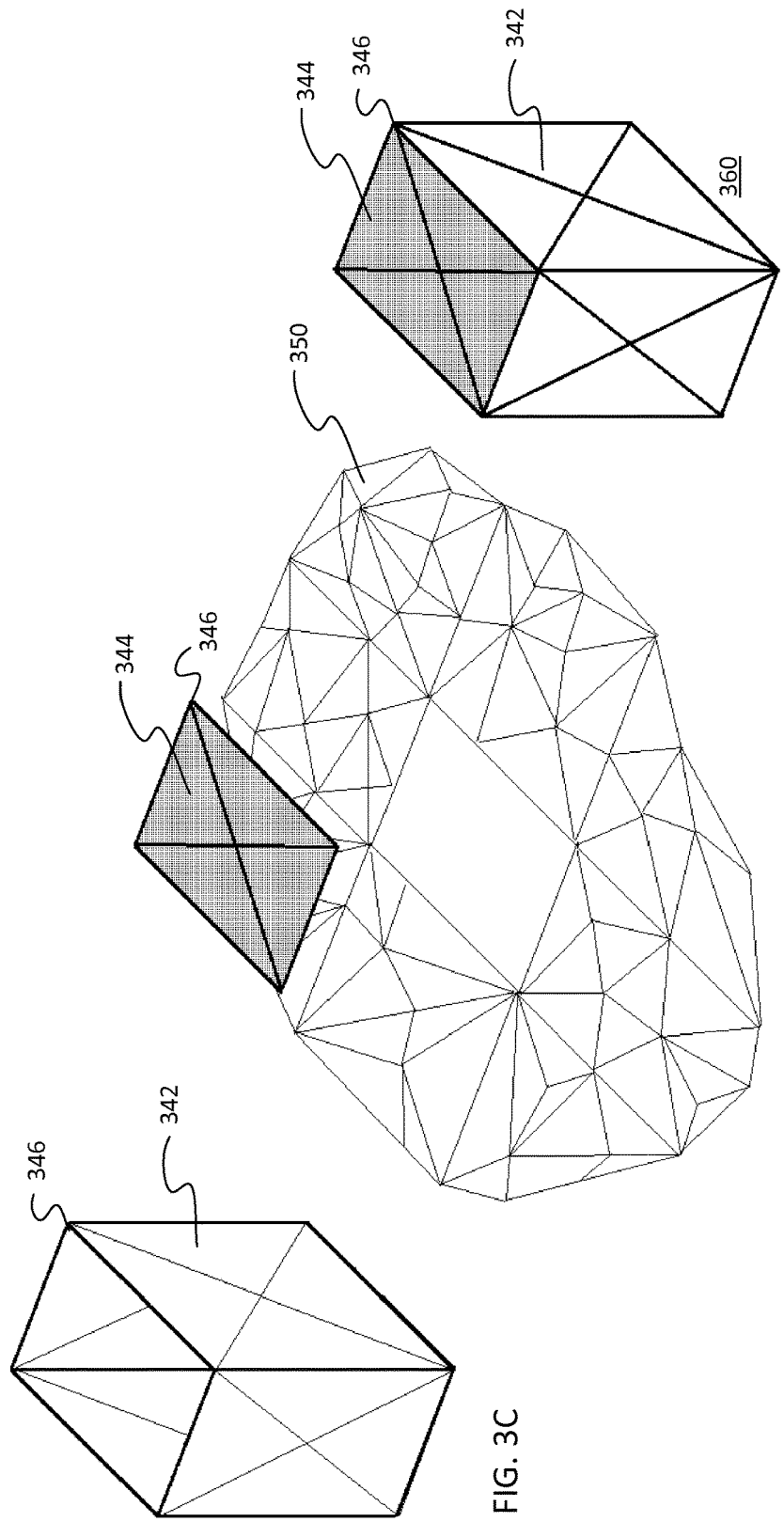

STRUCTURE MODEL SEGMENTATION FROM A THREE DIMENSIONAL SURFACE

BACKGROUND

The following disclosure generally relates to structure model segmentation and, more particularly, to structure model segmentation from a three dimensional surface mesh representing a geographic area.

Geographic mapping and modeling systems may include three dimensional (3D) models of structures in a geographic area to provide an augmented experience for a user. Some geographic areas, such as metropolitan areas, may involve numerous structures over a large geographic area. Manually creating 3D models for each structure in a metropolitan geographic area may be very labor intensive.

SUMMARY

In an embodiment, a non-transitory computer readable medium includes instructions that when executed on a computer are operable receive a three dimensional (3D) surface representing a geographic area, the 3D surface comprising surface elements and the geographic area comprising a structure having a geographic footprint smaller than the geographic area. The instructions may be further operable to distinguish vertically oriented surface elements from horizontally oriented surface elements of the 3D surface. The instructions may be further operable to identify horizontally oriented surface elements representing the structure, and associate vertically oriented surface elements with the horizontally oriented surface elements representing the structure to form a segmented model of the structure.

In an embodiment a method involves identifying data indicative of a 3D surface representing a geographic area, the 3D surface comprising surface elements and the geographic area comprising a structure having a geographic footprint smaller than the geographic area. The method may further involve distinguishing vertically oriented surface elements from horizontally oriented surface elements of the 3D surface. The method may further involve distinguishing ground surface elements from rooftop surface elements from the horizontally oriented surface elements of the 3D surface, and associating the vertically oriented surface elements with the rooftop surface elements to form a segmented model of the structure.

In an embodiment, an apparatus includes at least one processor and at least one memory including computer program code. The at least one memory and the computer program code are configured to, with the at least one processor, cause the apparatus to distinguish vertically oriented surface elements from horizontally oriented surface elements of a 3D surface representing a geographic area, the 3D surface comprising surface elements and the geographic area comprising at least one structure having a geographic footprint smaller than the geographic area. The apparatus may be further configured to distinguish ground surface elements from rooftop surface elements from the horizontally oriented surface elements of the 3D surface. The apparatus may be further configured to associate the vertically oriented surface elements with the rooftop surface elements to form at least one segmented model of the at least one structure.

BRIEF DESCRIPTION OF THE DRAWINGS

Exemplary embodiments of the present invention are described herein with reference to the following drawings:

FIG. 3A-E illustrate the segmentation of a model representing a structure from a three dimensional (3D) surface.

DETAILED DESCRIPTION OF THE PRESENTLY PREFERRED EMBODIMENTS

Data acquisition techniques, such as photogrammetry methods or Light Detection and Ranging (LIDAR), may be used to develop a three dimensional (3D) surface model representing an entire geographic area, however, the data may involve one continuous surface that does not delineate the structures, such as a building, wall, or other manmade or natural artifact, that exist in the geographic area from the rest of the 3D surface. Structures may be delineated from the rest of a 3D surface representing a geographic area using various techniques. In an embodiment, characteristics of the individual surface elements may be used to group and distinguish surface elements that represent structures from surface elements that represent non-structural portions of the geographic area. Once the surface elements representing the structure are identified, these surface elements may be grouped or otherwise associated to form a segmented independent model from the 3D surface. The grouped surface elements may then have information relating to the structure associated with the group.

A segmented 3D model of a structure may be positioned with other 3D models in a geographic mapping or modeling system according to an associated geographic location of the source structure for the constructed 3D model. Accurately representing geographic areas may involve collections of multiple structure 3D models. 3D models and collections of 3D models may be used in mapping, navigation, or enhanced reality applications where more detailed information regarding a geographic area may be desired, or required. Automatically constructing the 3D models of structures, as opposed to manually constructing 3D models, significantly reduces the resources required to create collections of 3D models required to accurately describe geographic areas, particularly metropolitan areas where the density of structures may be very significant.

In an embodiment, a user may view a model of a geographic area using a mobile device, such as may be implemented as described below with respect to FIG. 4. The model may include 3D representations of multiple structures in the geographic area. The user may then select a representation of a structure that has been segmented from a 3D surface model of the geographic area. Information relating specifically to that selected structure, or the geographic location of that structure, may be provided for the user. For example, a user may select a portion of a segmented model representing a building that houses a restaurant, and information related to the hours of operation, or even menu options, for the restaurant may be provided for the user.

Figure 1:
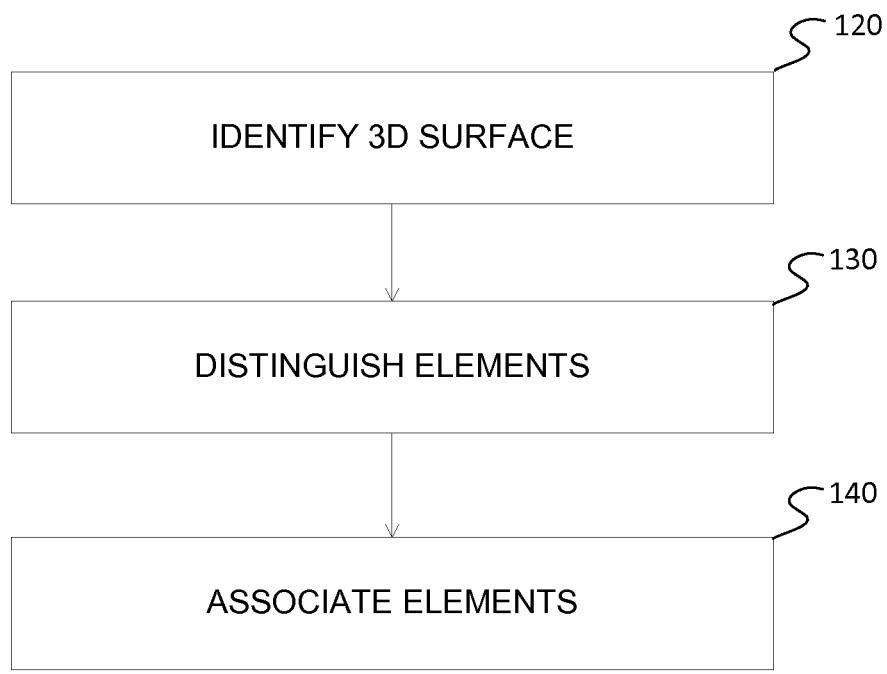
FIG. 1 illustrates an example embodiment for structure model segmentation.

FIG. 1 is a diagram illustrating an embodiment for structure model segmentation. In an embodiment, the embodiment may be implemented as computer program logic or computer readable program code stored in the memory and/or storage of a computer or system, such as the system 400 described below with respect to FIG. 4, and executable by one or more processors thereof to cause the system 400 to implement the disclosed functionality.

At act 120 a 3D surface representing a geographic area is identified. The 3D surface may be identified as data representing the 3D surface. The surface may involve surface elements and/or nodes defining the surface elements.

The geographic area may be any geographic area. For example, the geographic area may be a metropolitan area with multiple structures such as Chicago, Ill. The geographic area represented may be any size. For example, the geographic area may be limited to an area surrounding a single structure, or the geographic area may be much larger and encompass an entire metropolitan area or region. Also, the geographic area includes a structure that may have a geographic footprint, outline, or boundary smaller than the geographic area. The structure may be any type of structure such as a building, wall, or other manmade or natural structure.

The 3D surface may be any 3D surface. For example, the 3D surface may be the visible layer of a 3D model of a geographic area constructed from aerial imagery and assigned geographic coordinates combined with elevation data for particular points in the imagery to provide three dimensional orthogonal coordinates for each node of the 3D surface. The elevation data may be extracted from the photographs directly using photogrammetry and/or stereoscopic techniques, or any other technique capable of extracting dimensional data of structures from an image of a geographic area. For example, aerial photographs may be taken of a geographic area using an airplane or other aerial device. Dimensions of structures and other artifacts in the photographs may be interpreted based on geometry derived from the photographs individually, or in combination with a series of photographs, of the geographic area. The dimensions may then be correlated to geographic coordinates to establish a set of 3D coordinates that define elements of a 3D surface model of the geographic area. Further, the aerial photographs may provide textures to associate with the elements to give the 3D surface model a realistic appearance.

The 3D surface data may also be devised using LIDAR techniques. LIDAR, also known as LiDAR, Lidar, or other similar representations, is a remote sensing technology that measures distance by illuminating a target with a laser and analyzing the reflected light. Typically LIDAR uses ultraviolet, visible, or near infrared light to image objects and can be used with a wide range of targets. In an embodiment, a LIDAR data acquisition system may be attached or otherwise integrated with a vehicle. There may also be a positioning system integrated with the LIDAR vehicular system such as a Global Positioning System (GPS) to provide a base reference for the data acquired by the LIDAR system. For example, an airplane outfitted with appropriate geographic positioning equipment may also have photography and LIDAR capabilities. As the airplane flies over a geographic area the geographic location data, photographic data, and LIDAR data may be correlated to produce a 3D model representing the visible surface of the geographic area. Such a visible surface as depicted in a 3D model may be considered a 3D surface. A 3D model of a geographic area may not have individual structures of the geographic area delineated from other parts of the geographic area in the model. For example, even though a building may be visible in a model, there may be no distinction in the model or surface designating the building as separate from the rest of the model or surface.

The surface elements of the 3D surface may have associated properties. Properties may be associated using any technique, for example a table identifying an element and associated properties. The properties may be information related to the specific surface element. The properties may involve associations or groupings of elements. The properties may also involve geographic position data as well as textures or images to be displayed on the elements in a visible view of the elements. In an embodiment, the 3D surface may be an electronic photogrammetry model formatted in an OBJ format. In general, the 3D surface properties may include data indicating vertex coordinates, vertex normal directions, vertex mapping coordinates indicating a texture atlas, and triangle composition data, as well as other data or properties relating to the 3D model.

At act 130 elements of the 3D surface are distinguished using characteristics of the elements. Characteristics may be any value or quality of the elements that distinguishes an element from other elements. In an embodiment, orientation and/or elevation of the elements may provide a distinguishing characteristic. For example, vertically oriented elements may be distinguished from horizontally oriented elements. In an embodiment, groupings of elements based on similar characteristics may provide a distinguishing characteristic. For example, elements having a similar elevation may be grouped. Further, distinguished groups of elements may have additional characteristics which allow for further distinction within the groups. For example, elements grouped as horizontally oriented elements may further be distinguished based on elevation, and elements of similar elevation may be grouped.

In an embodiment, elements representing a ground surface may be distinguished from elements representing a rooftop of a structure by grouping horizontally oriented surface elements by elevation and proximity to other horizontally oriented surface elements. Proximity may be determined based on at least one shared node between elements.

In an embodiment, ground surface elements may be distinguished from rooftop surface elements by grouping horizontal surface elements that share a node and designating the largest resulting group of horizontal surface elements as ground surface elements.

At act 140, elements having different characteristics may be associated. In an embodiment, groupings of elements having characteristics that may identify the elements as representative of a structure may be associated. For example, elements having a vertical orientation may identify those elements as representative of structure walls or sides. Also, horizontally oriented elements having a certain elevation in a same proximate area of the 3D mesh may be representative of structure summits, rooftops, or other elevated horizontal surface of a structure. The vertical wall elements and the elevated horizontal elements may be associated such that together these elements form an independent model of the structure the elements represent as delineated from the 3D surface.

Figure 2:
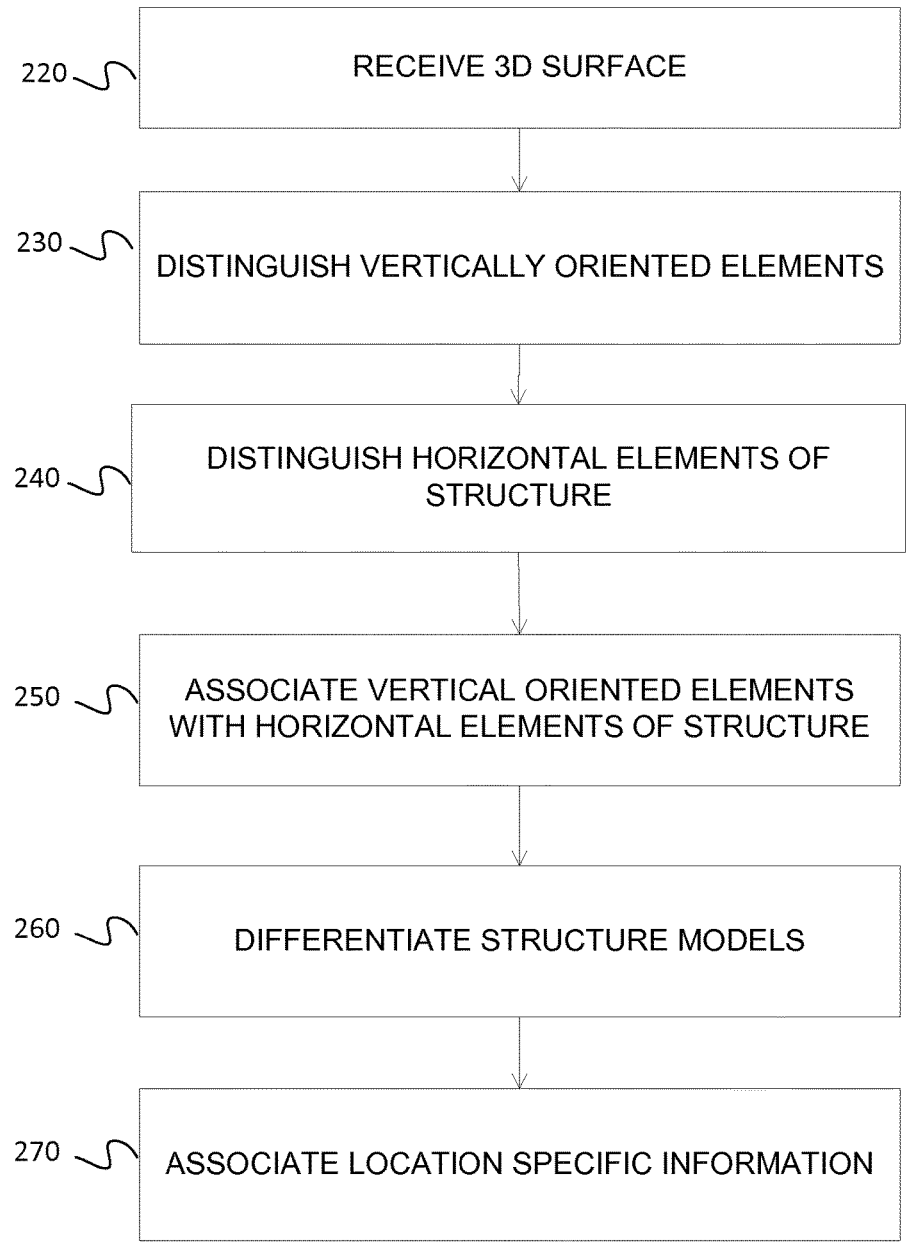
FIG. 2 illustrates another example embodiment for structure model segmentation.
Figure 3A:
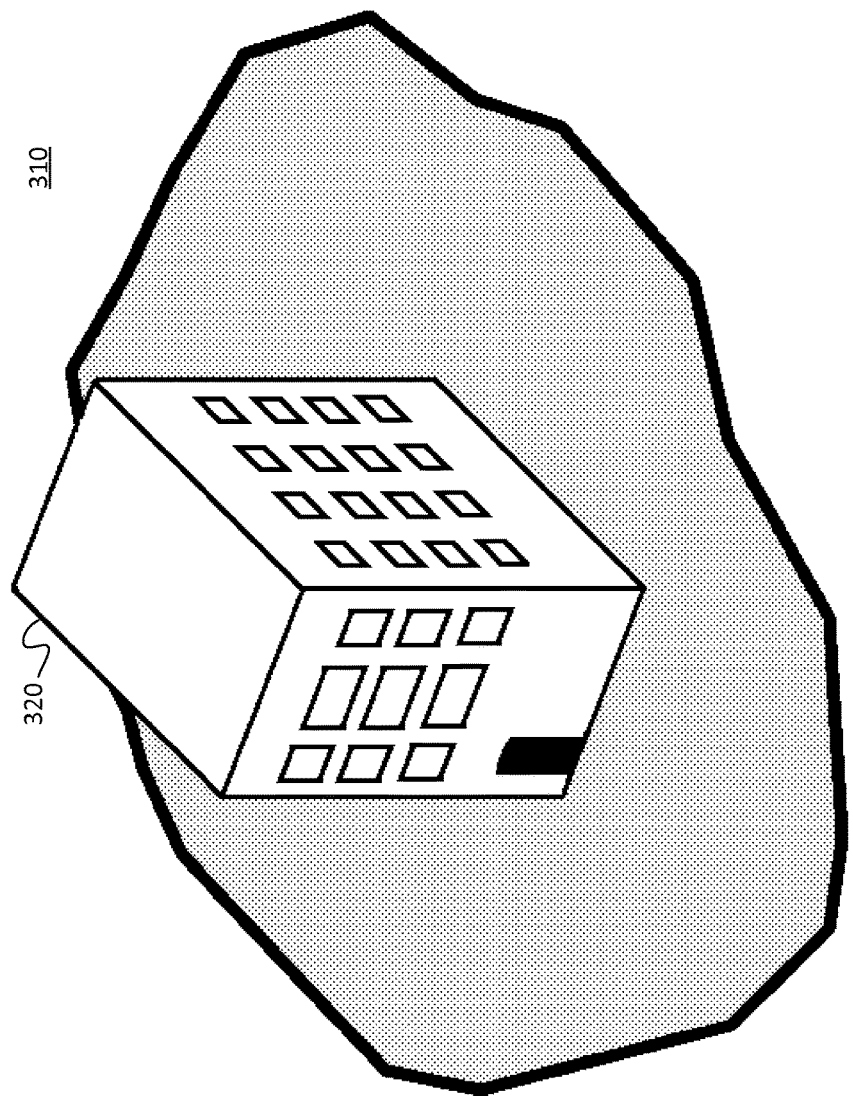
Figure 3B:
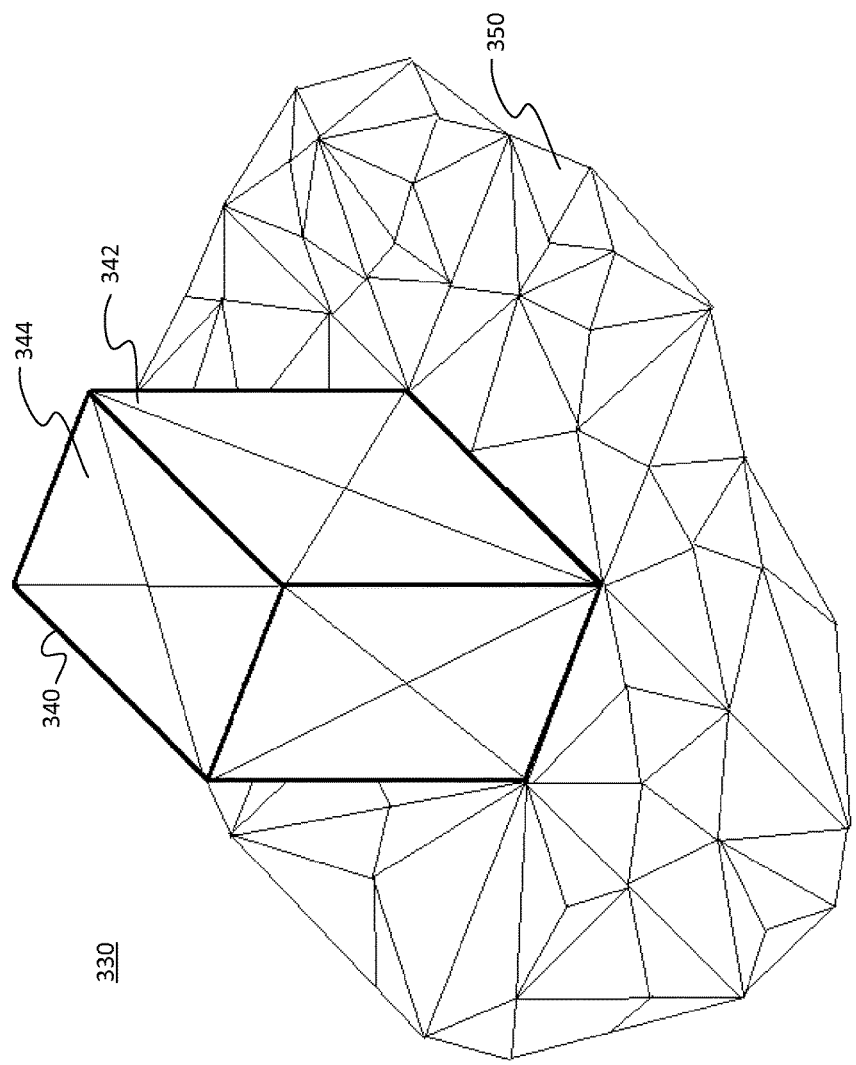

FIG. 2 is another diagram illustrating an embodiment for structure model delineation. More, fewer, or any combination of the acts indicated may be provided in an embodiment. In an embodiment, the method may be implemented as computer program logic or computer readable program code stored in the memory and/or storage of a computer or system, such as the system 400 described below with respect to FIG. 4, and executable by one or more processors thereof to cause the system 400 to implement the disclosed functionality.

In act 220 a 3D surface representing a geographic area is received. The surface may have elevation values associated with points or elements of the surface. Also, the geographic area involves a structure having a geographic footprint or structure perimeter smaller than the geographic area.

The 3D surface may be any surface capable of adequately describing a geographic area. The 3D surface may involve a mesh of connected points or nodes. The points may be connected in any fashion. For example, the points may be connected to form polygonal elements that when assembled produce the mesh. The polygonal elements may involve any shape of element. For example, triangular elements, rectangular elements, or hexagonal elements may be used.

In act 230, vertically oriented surface elements are distinguished from horizontally oriented surface elements of the 3D surface. Vertically oriented surface elements may be distinguished from horizontally oriented surface elements using any technique.

In an embodiment, vertically oriented surface elements are distinguished from horizontally oriented surface elements by determining whether a normal vector to each surface element of the 3D surface is above or below a threshold value for an angle formed between the normal vector and a horizontal plane of the 3D surface. For example the horizontal plane may be a plane representing a horizon for the 3D surface. For example, angles formed greater than the threshold may indicate vertically oriented surface elements and angles formed that are less than the threshold may indicate horizontally oriented surface elements. It will be recognized, however, that the effect of the threshold may be determined based on an orientation of the measurement of the angle, and as such vertical elements may be distinguished as having an angle less than a threshold. In an embodiment, the angle is measured from a vertical axis corresponding to an altitudinal or elevational axis and vertical elements will be distinguished as having an angle smaller than the threshold. In another embodiment, the angle may be measured from a horizontal axis such as a horizon oriented plane of geographic areas and vertical elements may be distinguished as having an angle smaller than the threshold. The threshold angle may be determined using any units or value representing an angle. For example, the threshold may be established in radians or degrees. Further, the threshold may be established prior to commencement of the distinguishing. Also, an initial threshold may be manually chosen and iterated until it is determined that vertical elements are accurately distinguished. In an embodiment, the threshold is 30 degrees measured from a horizontal plane.

In act 240, horizontal elements of the 3D surface representing a structure are distinguished from other horizontal elements of the 3D surface. Elements representing a structure may be distinguished using any technique.

In an embodiment, horizontal elements of the 3D surface are grouped based on shared nodes or adjacency. The largest resulting group or groups of horizontal elements are presumed to be elements representing the ground of the geographic area, and the remaining groupings of horizontal elements are presumed to represent horizontal surfaces of structures of the geographic area. For example, the remaining horizontal elements may represent rooftops of structures in the geographic area.

In an embodiment, horizontal elements of the 3D surface are grouped based on shared nodes or adjacency as well as altitude. Groups of horizontal elements having larger altitude values may be considered horizontal elements of a structure such as a rooftop.

In an embodiment involving a polygonal element 3D surface, an average elevation value may be determined for the polygonal element and associated with the area of the 2D plane representing the polygonal element. The average elevation may be determined by any method. In an embodiment the average elevation may be determined by determining the average of the defining mesh points of the 3D surface mesh. For example, the average of the three bounding points in a triangular mesh may be determined as the average elevation for the triangular element. Also, assigning the average elevation of the element may be performed using any technique. In an embodiment, the average may be assigned to a centroid of the element, as represented in the 2D plane. In an embodiment, integrated iterations of elements may be created and have elevations assigned. For example, a triangular element may have a determined centroid, and the existing bounding points may be connected to the centroid to form three elements from the original triangular element. In this manner, different resolutions of a mesh, or sizes of elements, may be used to refine elevation values as represented in a 2D plane.

As structures may have more than one horizontal surface, multiple horizontal surfaces representing a structure may be identified using the techniques identified herein.

In act 250, vertically oriented surface elements are associated with the horizontal structure surface elements to form a segmented model of the structure. The elements may be associated by identifying shared nodes between the vertically oriented surface elements and the horizontal structure surface elements and associating the elements having shared nodes. The segmented model may be used as a stand-alone model of the structure, or the segmented model may be used in combination with other models of structures in a geographic area.

Structures having multiple horizontal surfaces may involve associating multiple horizontally oriented elemental groups with vertically oriented elemental groups to more adequately describe the structure being represented as the segmented model.

In act 260, segmented models of multiple structures for a geographic area may be differentiated. A geographic area may involve multiple structures, and the structures may be adjacent or physically very close. A 3D surface representing such a geographic area will have surface elements corresponding to these multiple structures. Once surface elements representing the structures are segmented from other surface elements of the 3D surface model, surface elements representing the individual structures may need to be differentiated to create associated groups of surface elements for each individual structure.

The segmented models may be differentiated using any technique. In an embodiment, image files, or textures, associated with the surface elements for display may be analyzed. For example, textures resembling the actual appearance of the structure in the geographic area may be associated with the surface elements of the segmented models. As generally, each structure has a different appearance, the textures among the structures may vary. The varying properties of the different textures associated with the different surface elements of the different structures may be compared to differentiate the segmented models of the different structures. For example, the textures may have different color values or representations, and segmented models of a 3D surface may be differentiated by distinguishing the color values of the textures for each respective structure.

In an embodiment, the geographic area comprises a plurality of structures, and the associating the vertically oriented surface elements with the rooftop surface elements comprises associating surface elements representing different structures of the plurality of structures into different segmented models, wherein the segmented models of the different structures are differentiated using surface textures associated with surface elements of the associated surface elements. Further, surface textures may be associated with the surface elements of the 3D surface mesh and similar surface textures may be grouped to differentiate the segmented models.

In act 270, the segmented model may be associated with location specific data. The segmented model of the structure may be associated with data such that an indication or selection of any element of the segmented model may indicate a selection of the data associated with the model. In an embodiment, location specific data may be associated with the segmented model. The location specific data may be any data related to the geographic location of the structure. In an embodiment, location specific data may involve data relating to points of interest (POI) physically located in the structure, or otherwise associated with the structure's geographic location. In an embodiment, the segmented model and data relating to location specific data associated with the geographic location of the structure may be stored in a geographic database operable to provide the associated data when the segmented model is selected.

A geographic database may include geographic data used for mapping, navigation-related, or other enhanced experience or 3D modeling applications of geographic areas. The geographic data may include data representing a road network including road segment data, surface element, and/or node data. As indicated above, the geographic data may be correlated to a 3D surface model representing a geographic area. The geographic database may also include, or be coupled with, the 3D surface model, as well as POIs and the geographic locations of POIs. These POIs may be correlated to segmented models of structures using the geographic data. Examples of POIs include gas stations, restaurants, lodging, entertainment and educational opportunities (such as amusement parks, water parks, movie theaters, night spots, museums, and libraries), and historical or other types of landmarks.

FIGS. 3A-E illustrate the segmentation of a model 360 representing a structure 320 from a 3D surface 330 of a geographic area 310. The 3D surface 330 may include elements 340 representing a structure including elements representing vertically oriented sides of the structure 342 and elements representing horizontally oriented roof surfaces of the structure 344, as well as elements representing a ground surface 350 of the geographic area 310. The individual side 342, roof 344, and ground 350 elements, however, may not be designated as such, and therefore not segmented from the rest of the 3D surface 330.

A 3D segmented model 360 of the structure 320 may be isolated from the 3D surface 330 by distinguishing the vertically oriented surface elements 342 from the 3D surface 330 as illustrated in FIG. 3C. The ground surface elements 350 may then be distinguished from the roof surface elements 344 as shown in FIG. 3D. Ultimately, the roof surface elements 344 may be grouped, or otherwise associated, with the vertically oriented elements 342 by identifying a shared node 346 of the surface elements.

The resulting segmented model 360 of the structure may be grouped with other models to create a representation of a geographic area having multiple structures such that each of the structures may have specific information relating to the structure associated with the individual models. This information may be accessible to a user of the assembled model such that selecting an individual or segmented model may implicate the information.

In an embodiment, as may be implemented using components described below with respect to FIG. 4, a user may view a 3D model of a geographic area that includes segmented models of structures using a display 414. A user input device 416 may then be used to select a particular segmented model of a structure. Information associated with the structure, such as location specific information or point of interest information, may then be shown on the display. In an embodiment, the associated information may be displayed proximate to the display of the segmented model such that an association between the displayed model and information may be implied by the user. For example, the information may be displayed so as to cover a portion of the display of the segmented model. In another example, the information may be displayed in a prominent position of a display 414, such as the center of the display 414, subsequent to the selection of the segmented model. In an embodiment, the segmented model may be displayed with the information as a response to a query indicating the information.

Figure 4:
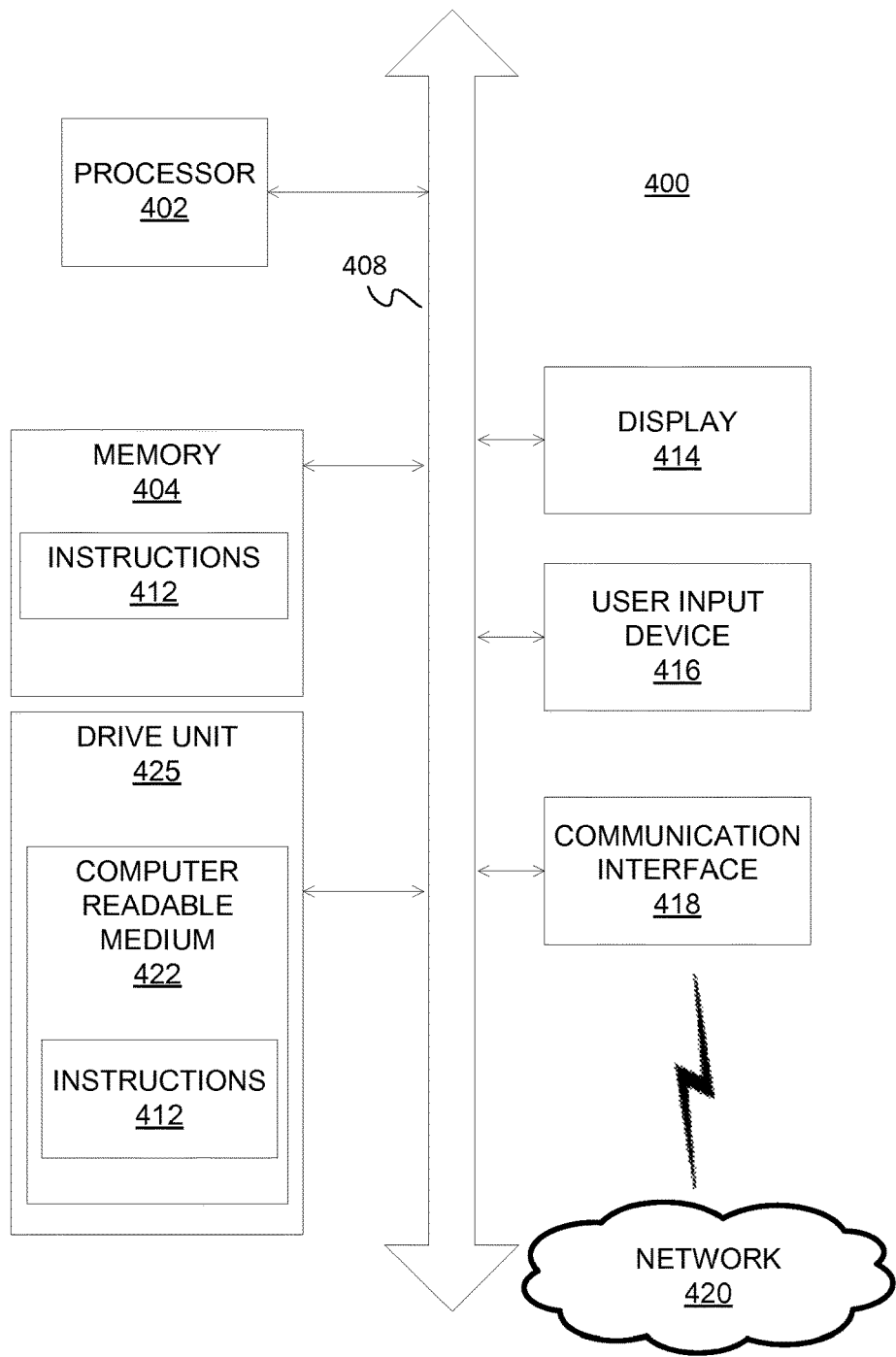
FIG. 4 depicts a system for structure model segmentation.

FIG. 4 provides an illustrative embodiment of a general computer system 400 for 3D model segmentation of a structure from a 3D surface. The computer system 400 can include a set of instructions that can be executed to cause the computer system 400 to perform any one or more of the methods or computer based functions disclosed herein. The computer system 400 may operate as a standalone device or may be connected, e.g., using a network, to other computer systems or peripheral devices. Any of the embodiments discussed above may be implemented using the computer system 400, multiple computer systems 400, or a component in the computer system 400.

In a networked deployment, the computer system 400 may operate in the capacity of a server or as a client user computer in a client-server user network environment, or as a peer computer system in a peer-to-peer (or distributed) network environment. The computer system 400 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 400 can be implemented using electronic devices that provide voice, video or data communication. Further, while a single computer system 400 is illustrated, the term "system" shall also be taken to include any collection of systems or sub-systems that individually or jointly execute a set, or multiple sets, of instructions to perform one or more computer functions.

As illustrated in FIG. 4, the computer system 400 may include a processor 402, e.g., a central processing unit (CPU), a graphics processing unit (GPU), or both. The processor 402 may be a component in a variety of systems. For example, the processor 402 may be part of a standard personal computer or a workstation. The processor 402 may be one or more general processors, digital signal processors, application specific integrated circuits, field programmable gate arrays, servers, networks, digital circuits, analog circuits, combinations thereof, or other now known or later developed devices for analyzing and processing data. The processor 402 may implement a software program, such as code generated manually (i.e., programmed). In an embodiment, the processor 402 may be configured to project elevation values from a 3D surface of a geographic area into a 2D plane, and construct a 3D model of a structure in the geographic area based on the elevation values in the 2D plane.

In an embodiment, at least one processor 402 may be configured to cause the system 400 to distinguish vertically oriented surface elements from horizontally oriented surface elements of a three 3D surface representing a geographic area, the 3D surface comprising surface elements and the geographic area comprising at least one structure having a geographic footprint smaller than the geographic area. The at least one processor 402 may also be configured to cause the system 400 to distinguish ground surface elements from rooftop surface elements from the horizontally oriented surface elements of the 3D surface. The at least one processor 402 may also be configured to cause the system 400 to associate the vertically oriented surface elements with the rooftop surface elements to form at least one segmented model of the at least one structure.

The computer system 400 may include a memory 404 that can communicate via a bus 408. The memory 404 may be a main memory, a static memory, or a dynamic memory. The memory 404 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one embodiment, the memory 404 includes a cache or random access memory for the processor 402. In alternative embodiments, the memory 404 is separate from the processor 402, such as a cache memory of a processor, the system memory, or other memory. The memory 404 may be an external storage device or database for storing data. Examples include a hard drive, compact disc ("CD"), digital versatile disc ("DVD"), memory card, memory stick, floppy disc, universal serial bus ("USB") memory device, or any other device operative to store data. The memory 404 is operable to store instructions executable by the processor 402. The functions, acts or tasks illustrated in the figures or described herein may be performed by the programmed processor 402 executing the instructions 412 stored in the memory 404. The functions, acts or tasks are independent of the particular type of instructions set, storage media, processor or processing strategy and may be performed by software, hardware, integrated circuits, firmware, microcode and the like, operating alone or in combination. Likewise, processing strategies may include multiprocessing, multitasking, parallel processing and the like. In an embodiment, the memory 404 may be configured to store data representing a 3D surface of a geographic area, as well as data representing images derived from elevation values of the 3D surface and a 3D model of a structure in the geographic area.

In an embodiment, instructions 412 may be configured such that when executed by the system 400 the instructions 412 are operable to receive a 3D surface representing a geographic area, the 3D surface comprising surface elements and the geographic area comprising a structure having a geographic footprint smaller than the geographic area. The instructions may further be operable to cause the system 400 to distinguish vertically oriented surface elements from horizontally oriented surface elements of the 3D surface. The instructions may further be operable to cause the system 400 to identify horizontally oriented surface elements representing the structure, and associate vertically oriented surface elements with the horizontally oriented surface elements representing the structure to form a segmented model of the structure.

As shown, the computer system 400 may further include a display unit 414, such as a liquid crystal display (LCD), an organic light emitting diode (OLED), a flat panel display, a solid state display, a cathode ray tube (CRT), a projector, a printer or other now known or later developed display device for outputting determined information. The display 414 may act as an interface for the user to see the functioning of the processor 402, or specifically as an interface with the software stored in the memory 404 or in the drive unit 406. In an embodiment, the display 414 may be operational to display a representation of a geographic area using 3D data points taken from the geographic area. The display 414 may also be operational to display a 3D surface representing a geographic area, segmented models of the 3D surface, as well as information related to structures the segmented models represent.

Additionally, the computer system 400 may include an input device 416 configured to allow a user to interact with any of the components of system 400. The input device 416 may be a number pad, a keyboard, or a cursor control device, such as a mouse, or a joystick, touch screen display, remote control or any other device operative to interact with the system 400. The input device may be operational to facilitate the interaction of a user with a 3D model. The input device may also be operational to facilitate a manual selection of a segmented model.

In a particular embodiment, as depicted in FIG. 4, the computer system 400 may also include a disk or optical drive unit 406. The disk drive unit 406 may include a computer-readable medium 410 in which one or more sets of instructions 412, e.g. software, can be embedded. Further, the instructions 412 may embody one or more of the methods or logic as described herein. In a particular embodiment, the instructions 412 may reside completely, or at least partially, within the memory 404 and/or within the processor 402 during execution by the computer system 400. The memory 404 and the processor 402 also may include computer-readable media as discussed above.

The present disclosure contemplates a computer-readable medium that includes instructions 412 or receives and executes instructions 412 responsive to a propagated signal, so that a device connected to a network 420 can communicate voice, video, audio, images or any other data over the network 420. Further, the instructions 412 may be transmitted or received over the network 420 via a communication interface 418. The communication interface 418 may be a part of the processor 402 or may be a separate component. The communication interface 418 may be created in software or may be a physical connection in hardware. The communication interface 418 is configured to connect with a network 420, external media, the display 414, or any other components in system 400, or combinations thereof. The connection with the network 420 may be a physical connection, such as a wired Ethernet connection or may be established wirelessly as discussed below. Likewise, the additional connections with other components of the system 400 may be physical connections or may be established wirelessly. In an embodiment, 3D data points representing a geographic area may be received by the communication interface 418 via the network 420.

The network 420 may include wired networks, wireless networks, or combinations thereof. The wireless network may be a cellular telephone network, an 802.11, 802.16, 802.20, or WiMax network. Further, the network 420 may be a public network, such as the Internet, a private network, such as an intranet, or combinations thereof, and may utilize a variety of networking protocols now available or later developed including, but not limited to TCP/IP based networking protocols.

In an embodiment, the system 400 may be operable to receive a 3D surface representing a geographic area, the 3D surface comprising surface elements and the geographic area comprising a structure having a geographic footprint smaller than the geographic area using the communication interface 418, via the network 420. The 3D surface may be stored on the memory 404, 422. The processor 402 may be configured to cause the system to distinguish vertically oriented surface elements from horizontally oriented surface elements of the 3D surface, identify horizontally oriented surface elements representing the structure, and associate vertically oriented surface elements with the horizontally oriented surface elements representing the structure to form a segmented model of the structure.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a computer readable medium for execution by, or to control the operation of, data processing apparatus. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein. The computer readable medium can be a machine-readable storage device, a machine-readable storage substrate, a memory device, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Although the present specification describes components and functions that may be implemented in particular embodiments with reference to particular standards and protocols, the invention is not limited to such standards and protocols. For example, standards for Internet and other packet switched network transmission (e.g., TCP/IP, UDP/IP, HTML, HTTP, HTTPS) represent examples of the state of the art. Such standards are periodically superseded by faster or more efficient equivalents having essentially the same functions. Accordingly, replacement standards and protocols having the same or similar functions as those disclosed herein are considered equivalents thereof.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and anyone or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a device having a display, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings and described herein in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

It is therefore intended that the foregoing detailed description be regarded as illustrative rather than limiting, and that it be understood that it is the following claims, including all equivalents, that are intended to define the spirit and scope of this invention.

I claim:

1. A method for causing information corresponding to a particular structure to be provided a graphical user interface, the method comprising:
    displaying a three dimensional (3D) model representing a geographic area via a graphical user interface of a display unit of an apparatus, the 3D model comprising one or more segmented models of one or more structures located in the geographic area, wherein the apparatus comprises (a) at least one processor, (b) the display unit, (c) a user input device, and (d) at least one memory including computer program code;
    receiving via the user input device a user selection of a particular segmented model of the one or more segmented models, the particular segmented model corresponding to a particular structure of the one or more structures; and
    responsive to receiving the user selection, displaying via the graphical user interface information corresponding to the particular structure,
    wherein the 3D model is generated by a computing system by:
        identifying, by the computing system comprising a processor and a computer-readable memory, data indicative of a 3D surface representing the geographic area, the 3D surface comprising surface elements defined by a plurality of nodes and the geographic area comprising the one or more structures each having a geographic footprint smaller than the geographic area;
        distinguishing, by the processor of the computing system, vertically oriented surface elements from horizontally oriented surface elements of the 3D surface, wherein (a) a first vertically oriented surface element of the vertically oriented surface elements is defined by a plurality of vertical surface element nodes of the plurality of nodes and (b) a first horizontally oriented surface element of the horizontally oriented surface elements is defined by a plurality of horizontal surface element nodes of the plurality of nodes;
        distinguishing, by the processor of the computing system, ground surface elements from rooftop surface elements of the horizontally oriented surface elements of the 3D surface, wherein the ground surface elements are distinguished from the rooftop surface elements, by:
            grouping, by the processor of the computing system, horizontal surface elements that share a node, and
            designating, by the processor of the computing system, a largest resulting group of horizontal surface elements as ground surface elements, wherein the rooftop surface elements comprise the first horizontally oriented surface element; and
        associating, by the processor of the computing system, the first vertically oriented surface element the first horizontally oriented surface element to form a segmented model of the structure by identifying shared nodes of the plurality of vertical surface element nodes and the plurality of horizontal surface element nodes.

2. The method of claim 1, wherein the computing system associates location specific data with the segmented model of the structure.

3. The method of claim 2, wherein the location specific data comprises data relating to a point of interest (POI) physically located in the structure.

4. The method of claim 2, wherein the segmented model and the location specific data are stored in a geographic database and the geographic database is operational to provide the location specific data when the segmented model is selected.

5. The method of claim 4, wherein the location specific data is provided on the graphical user interface by the display unit proximate to a representation of the segmented model.

6. The method of claim 1, wherein the distinguishing vertically oriented surface elements from horizontally oriented surface elements comprises determining whether a normal vector to each surface element of the 3D surface is above or below a threshold value for an angle formed between the normal vector and a horizontal plane of the 3D surface.

7. The method of claim 6, wherein the threshold value for the angle is 30 degrees from the horizontal plane, and angle values above the threshold indicate vertically oriented surface elements and angle values below 30 degrees indicate horizontally oriented surface elements.

8. The method of claim 1, wherein the distinguishing ground surface elements from rooftop surface elements comprises grouping the horizontally oriented surface elements by elevation and proximity to other horizontally oriented surface elements.

9. The method of claim 1, wherein the computing system associates a texture with at least one of the first vertically oriented surface element or the first horizontally oriented surface element.

10. The method of claim 1, wherein the computing system:
    causes a communication interface of the computing system to communicate via at least one network to provide the segmented model to the apparatus as part of a geographic database, the at least one segmented model configured to be displayed as part of a representation of the geographic area via the graphical user interface of the display unit of the apparatus and the geographic database configured to be stored in the at least one memory of the apparatus;
    receiving, by the processor, a selection of one of the first vertically oriented surface elements or the first horizontally oriented surface elements, via the communication interface, the selection of the vertically oriented surface element or the rooftop surface element being received via the user input device of the apparatus; and
    causing, by the processor, the communication interface to communicate via the at least one network to provide location data associated with the at least one segmented model of the at least one structure, the information corresponding to the particular structure comprising the location data.

11. An apparatus comprising:
    at least one processor;
    a display unit for providing a graphical user interface;
    a user input device; and
    at least one memory including computer program code;
    the at least one memory and the computer program code configured to, with the at least one processor, cause the apparatus to at least:
        provide a three dimensional (3D) model representing a geographic area via the display unit, the 3D model comprising one or more segmented models of one or more structures located in the geographic area;

receive via the user input device a user selection of a particular segmented model of the one or more segmented models, the particular segmented model corresponding to a particular structure of the one or more structures; and responsive to receiving the user selection, provide via the display unit information corresponding to the particular structure, wherein the 3D model is generated by a computing system by:

distinguishing vertically oriented surface elements from horizontally oriented surface elements of the 3D surface representing the geographic area, the 3D surface comprising surface elements defined by a plurality of nodes and the geographic area comprising the one or more structures each having a geographic footprint smaller than the geographic area, wherein (a) a first vertically oriented surface element of the vertically oriented surface elements is defined by a plurality of vertical surface element nodes of the plurality of nodes and (b) a first horizontally oriented surface element of the horizontally oriented surface elements is defined by a plurality of horizontal surface element nodes of the plurality of nodes;

distinguishing ground surface elements from rooftop surface elements from the horizontally oriented surface elements of the 3D surface, wherein the ground surface elements are distinguished from the rooftop surface elements, by:

grouping horizontal surface elements that share a node, and designating, by the processor, a largest resulting group of horizontal surface elements as ground surface elements, wherein the rooftop surface elements comprise the first horizontally oriented surface element;

associating the first vertically oriented surface element with the first horizontally oriented surface element to form at least one segmented model of the at least one structure by identifying shared nodes of the plurality of vertical surface element nodes and the plurality of horizontal surface element nodes; and causing a communication interface to communicate via at least one network to provide the at least one segmented model to an apparatus as part of a geographic database, the at least one segmented model configured to be displayed as part of a representation of the geographic area via a display of the mobile device.

12. The apparatus of claim 11, wherein the geographic area comprises a plurality of structures, and the associating the vertically oriented surface elements with the rooftop surface elements comprises associating surface elements representing different structures of the plurality of structures into different segmented models, wherein the segmented models of the different structures are differentiated using surface textures associated with surface elements of the associated surface elements.

13. The apparatus of claim 12, wherein surface textures are associated with the surface elements of the 3D surface mesh and similar surface textures are grouped to differentiate the segmented models.

14. The apparatus of claim 11, wherein the at least one memory and the computer program code are further configured to, with the at least one processor, cause the apparatus to at least associate location specific data with the segmented model of the particular structure.

15. The apparatus of claim 14, wherein the location specific data comprises data relating to a point of interest (POI) physically located in the structure.

16. The apparatus of claim 14, wherein the segmented model and the location specific data are stored in a geographic database and the geographic database is operational to provide the location specific data when the segmented model is selected.

17. The apparatus of claim 11, wherein the distinguishing vertically oriented surface elements from horizontally oriented surface elements by the computing system comprises determining whether a normal vector to each surface element of the 3D surface is above or below a threshold value for an angle formed between the normal vector and a horizontal plane of the 3D surface.

18. The apparatus of claim 17, wherein the threshold value for the angle is 30 degrees from the horizontal plane, and angle values above the threshold indicate vertically oriented surface elements and angle values below 30 degrees indicate horizontally oriented surface elements.

19. The apparatus of claim 11, wherein distinguishing ground surface elements from rooftop surface elements by the computing system involves grouping the horizontally oriented surface elements by elevation and proximity to other horizontally oriented surface elements.

* * * * *